(12) United States Patent
Feng et al.

(10) Patent No.: US 7,393,461 B2
(45) Date of Patent: Jul. 1, 2008

(54) MICROETCHING SOLUTION

(76) Inventors: Kesheng Feng, 269 Spruce St., Cheshire, CT (US) 06410; Nilesh Kapadia, 71 Coram Rd., Shelton, CT (US) 06484; Steve Castaldi, 134 Farmstead La., Torrington, CT (US) 06790

( * ) Notice: Subject to any disclaimer, the term of this patent is extended or adjusted under 35 U.S.C. 154(b) by 206 days.

(21) Appl. No.: 11/209,471

(22) Filed: Aug. 23, 2005

(65) Prior Publication Data

US 2007/0051693 A1    Mar. 8, 2007

(51) Int. Cl.
| | |
|---|---|
| *B44C 1/22* | (2006.01) |
| *C03C 15/00* | (2006.01) |
| *C03C 25/68* | (2006.01) |
| *C23F 1/00* | (2006.01) |
| *C25F 3/00* | (2006.01) |

(52) U.S. Cl. .................................................. 216/106
(58) Field of Classification Search ................ 216/105, 216/106, 107
See application file for complete search history.

(56) References Cited

U.S. PATENT DOCUMENTS

| | | | |
|---|---|---|---|
| 3,627,687 A * | 12/1971 | Teumac et al. ............... 510/253 |
| 4,873,136 A | 10/1989 | Foust et al. | |
| 5,532,094 A | 7/1996 | Arimura et al. | |
| 5,700,389 A | 12/1997 | Nakagawa | |
| 5,807,493 A * | 9/1998 | Maki et al. ................... 216/106 |
| 5,876,490 A | 3/1999 | Ronay | |
| 5,965,036 A | 10/1999 | Maki et al. | |
| 6,426,020 B1 | 7/2002 | Okada et al. | |
| 6,506,314 B1 | 1/2003 | Whitney, Jr. et al. | |
| 6,830,627 B1 | 12/2004 | Covert et al. | |
| 6,861,010 B2 | 3/2005 | Hirabayashi | |
| 2003/0164466 A1 | 9/2003 | Hauf et al. | |

FOREIGN PATENT DOCUMENTS

| | | |
|---|---|---|
| JP | 2000-282265 | 10/2000 |
| JP | 2000282265 A * | 10/2000 |

* cited by examiner

*Primary Examiner*—Roberts Culbert
(74) *Attorney, Agent, or Firm*—Carmody & Torrance LLP

(57) ABSTRACT

The present invention related to an improved microetching solution and a method of using the improved composition for roughening a metal surface and increasing the adhesion strength of a metal layer to a subsequently applied layer. The microetching composition is an aqueous solution comprising cupric ion source, a pyridine derivative, multiethyleneamine, and an acid. In a preferred embodiment, the microetching solution of the invention also comprises a source of halide ions such as sodium chloride or hydrochloric acid.

17 Claims, 8 Drawing Sheets

SEM

Nickel plating

Tin plating

SEM

Nickel plating

Tin plating

SEM

Nickel plating

Tin plating

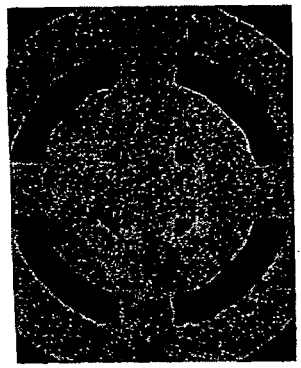
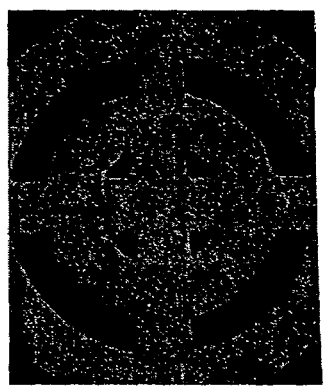
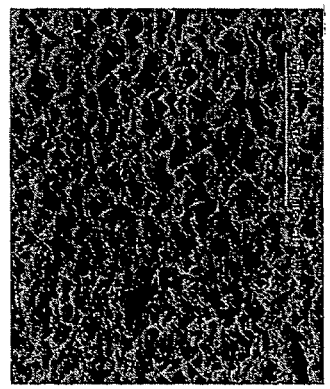
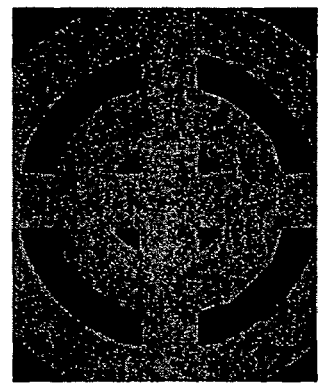
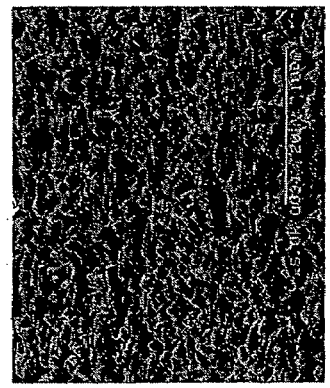
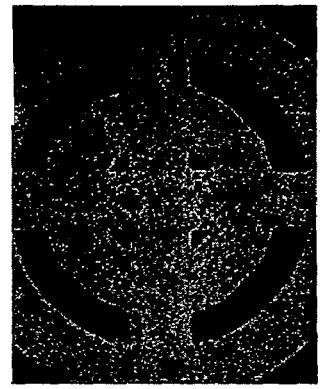
FIG. 3A  FIG. 3B  FIG. 3C
FIG. 4A  FIG. 4B  FIG. 4C

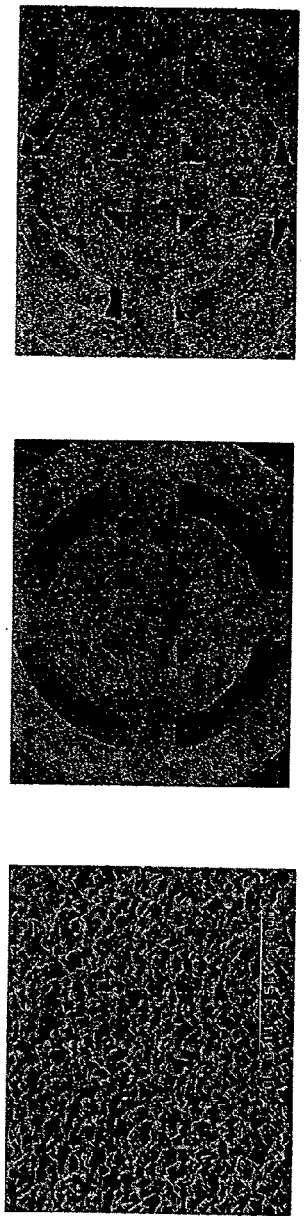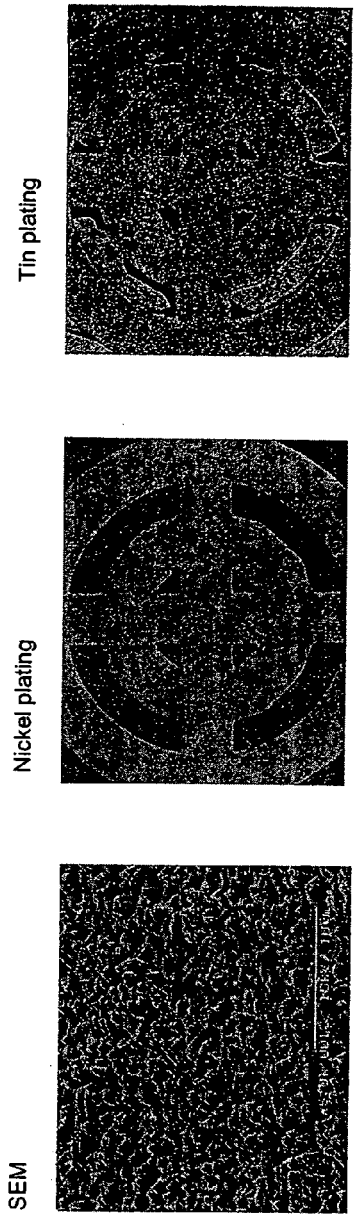
FIG. 7A  FIG. 7B  FIG. 7C
FIG. 8A  FIG. 8B  FIG. 8C

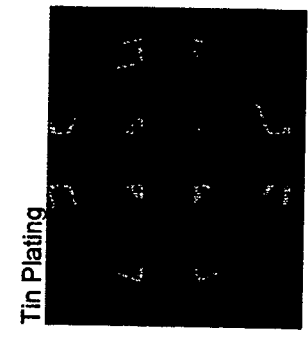
FIG. 12C
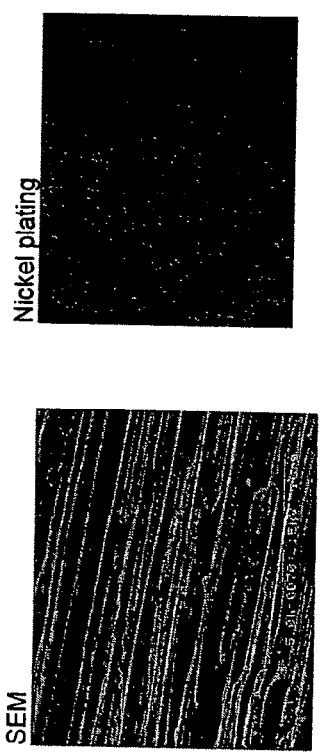
FIG. 12B
FIG. 12A
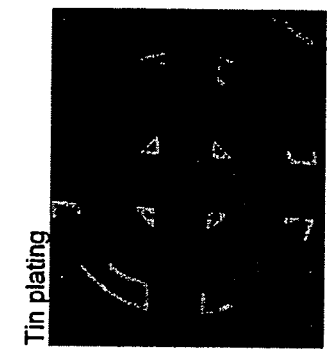
FIG. 13C
FIG. 13B
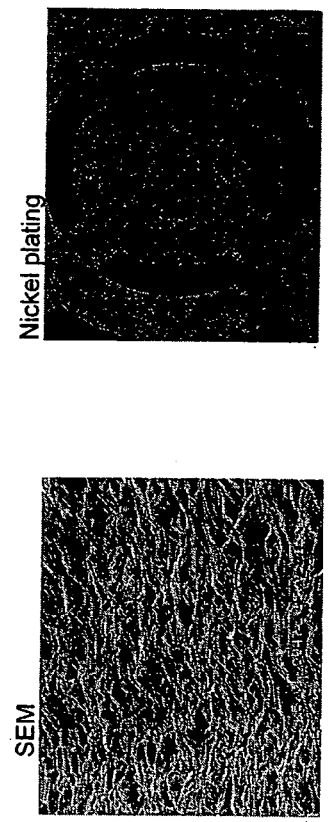
FIG. 13A

MICROETCHING SOLUTION

FIELD OF THE INVENTION

The present invention is directed to an improved microetching solution that provides good adhesion for solder mask applications and to an improved method of microetching a copper surface for subsequent plating thereon.

BACKGROUND OF THE INVENTION

In the manufacture of printed circuit boards, copper surfaces are coated with various organic films, including etch resists, plating resists, solder masks and other dielectric materials. These films can be applied to the board surfaces as a liquid or as a dry film resist. In any case, good adhesion of the film to the surfaces is necessary in order to prevent the film from etching off or flaking from the surfaces.

In some cases, such as with solder masks, the film remains permanently on the surfaces after it has been applied thereto. In this instance, a tight bond to the copper surfaces is required since the mask protects certain areas of the copper surfaces prior to contact with molten solder during the soldering process or prior to treatment with corrosive chemicals which come into contact with the uncoated areas before metal layers are deposited.

In other instances, such as when an etch resist is used, the film remains on the copper surfaces only temporarily. Good adhesion is necessary because the etch resist protects certain areas of the copper surfaces against an attack from corrosive chemicals used to remove copper areas being exposed by etching. After the resist has been etched, it is removed again.

Improving adhesion of an organic film on a smooth copper surface typically is accomplished by roughening the surfaces. This may be carried out by mechanical means, for example by grinding or by treatment of the surface with a slurry of pumice in water. In the alternative, the surfaces may be roughened by chemical means (e.g., microetching), with solutions based on persulfates or hydrogen peroxide and sulfuric acid (among others).

In the manufacture of printed-wiring boards, copper surfaces are roughened in order to improve adhesion of etching resists or solder resists to be coated on the copper surfaces. Microetching is also used for improving solderability, for example, as a pretreatment for a solder coating step or for removing oxides from copper surfaces before soldering electronic parts.

These roughening methods have proven problematic in that the organic films do not have sufficient adhesion to the copper surfaces if they are deposited onto the copper surfaces of very narrow conductor lines and onto extremely fine solder pads or bond pads. Improved etching compositions are needed that provide a good grain structure on the copper surface and provide good adhesion during solder mask applications.

It is an object of the present invention to provide a surface treating composition for copper and copper alloys which can exhibit excellent adhesiveness to solder resists and the like and provide roughened surfaces of copper or copper alloys with adequate surface structure and superior solderability.

SUMMARY OF THE INVENTION

The present invention is directed to an aqueous microetching solution comprising:
 a cupric ion source;
 a pyridine derivative;
 a multiethyleneamine; and
 an acid.

The present is also directed to an improved method of roughening a copper or copper alloy surface to provide improved adhesion of a layer subsequently applied thereto, comprising contacting the copper or copper alloy surface with a microetching composition comprising a cupric ion source, a pyridine derivative, multiethyleneamine, and an acid in an amount and for a period of time to roughen the surface.

BRIEF DESCRIPTION OF THE DRAWINGS

FIGS. 3A-3C depict SEM images of another copper substrate treated with a microetching composition of the invention, in which the concentration of picoline is varied.

FIGS. 4A-4C depict SEM images of another copper substrate treated with a microetching composition of the invention, in which the concentration of picoline is varied.

FIGS. 7A-7C depict SEM images of another copper substrate treated with a microetching composition of the invention, in which the concentration of multiethylene amine is varied.

FIGS. 8A-8C depict SEM images of another copper substrate treated with a microetching composition of the invention, in which the concentration of multiethylene amine is varied.

FIGS. 12A-12C depict SEM images of a copper substrate that has been mechanically microetched.

FIGS. 13A-13C depict SEM images of a copper substrate treated with a microetching composition based on standard peroxide/sulfuric acid chemistry.

DETAILED DESCRIPTION OF THE PREFERRED EMBODIMENTS

Figure 1A:
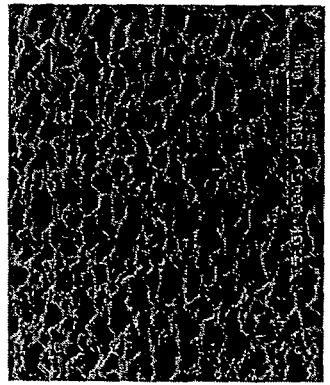
FIGS. 1A-1C depict Scanning Electron Microscope (SEM) images of a copper substrate treated with a microetching composition of the invention.

The inventors of the present invention have surprisingly discovered that a microetching composition comprising a pyridine derivative and multiethyleneamine provides a superior micro-roughened surface as compared to prior art methods.

The present invention is directed to an aqueous microetching solution comprising:
- a cupric ion source;
- a pyridine derivative;
- a multiethyleneamine; and
- an acid.

The cupric ion source functions as an oxidizing agent to oxidize the metal surface, which is typically copper, copper alloy, or the like. The use of the cupric ion source as the oxidizing agent ensures that the microetching composition exhibits a suitable etching speed and etching depth. Suitable examples of the cupric ion source include cupric salts of organic acids, such as cupric chloride, cupric bromide, and cupric hydroxide. Preferably, the cupric ion source is cupric chloride. The cupric ion source is typically used in the microetching solution at a concentration of about 10-50 g/l, and more preferably, at a concentration of about 20-30 g/l.

In a preferred embodiment, the pyridine derivative is picoline. Other pyridine derivatives usable in the invention include 2-methylpyridine, 2-aminopyridine, 2-aminomethylpyridine, 2-carboxypyridine, 4-methylpyridine, 4-aminopyridine, 4-aminomethylpyridine, and the like. 2,4-diamino-6-methyltriazine, 2,4-diamino-6-ethyltriazine, and the like are given as examples of the triazine derivatives. The pyridine derivative is typically used in the microetching solution at a concentration of about 25-125 ml/l, and more preferably, at a concentration of about 50-100 ml/l.

The multiethyleneamine is selected so that it gives optimized performance to roughen the copper surface. The multiethyleneamine is a low molecular weight polyimine, which is more like an oligomer. One suitable multiethyleneamine that is usable in the invention is polyethylenimine, Mn=423 or Mn=600, available from Aldrich Chemical Company. The multiethyleneamine is typically used in the microetching solution at a concentration of about 100-1000 parts per million, and more preferably, at a concentration of about 100-600 parts per million.

The inorganic acid is added to etching solution for the purposes of stabilizing the etching speed and ensuring homogeneous etching without unevenness. Specific examples of the inorganic acid include sulfuric acid, hydrochloric acid, and the like. Sulfuric acid is preferred in view of the easiness in handling. The acid is used in an amount sufficient to maintain the pH of the solution at about 0.3-3.5.

In a preferred embodiment, the microetching solution of the invention also comprises a source of halide ions such as sodium chloride or hydrochloric acid.

The invention is also directed to an improved method of roughening a copper or copper alloy surface to provide improved adhesion of a layer subsequently applied thereto, comprising contacting the copper or copper alloy surface with a microetching composition comprising a cupric ion source, a pyridine derivative, multiethyleneamine, and an acid in an amount and for a period of time to roughen the surface.

There are no specific limitations to the method of applying the microetching composition of the present invention. Examples include spraying the composition solution to the surfaces of copper or copper alloy to be treated, immersing the copper or copper alloy in the solution using an immersion conveyer, and the like. However, it is desirable to control the microetching depth to about 50-70 microinches in the copper surface, more preferably to about 55-65 microinches in the copper surface.

In one embodiment, the microetching solution is applied by spraying onto the copper or copper alloy substrate with a dwell time of about 25-45 seconds. More preferably, the dwell time is about 30 to about 40 seconds.

The surface treating composition can be prepared by adding the above-mentioned components, at proportions described above, to water and blending the mixture. There are no specific limitations to the method of addition. The components may be added either all at one time or separately in any arbitrary order. Deionized water is preferably used as the water.

The etching solution of the present invention can be widely used for chemical cleaning or the like of copper or copper alloys. For example, in the manufacture of multi-layered printed-wiring boards, it can be used for oxide-removal and roughening prior to the oxide treatment of the copper surface, for roughening to improve the adhesiveness of etching resists and solder resists, and for oxide-removal and roughening to improve the solderability. The etching solution of the present invention can be used for roughening and rust-prevention of a variety of materials made from copper or copper alloy.

Other features of the invention will become apparent in the course of the examples that follow, which are give for illustration of the invention and are not intended to limiting thereof.

EXAMPLES

Copper panels were roughened using one of the methods described in the examples below and were then processed by solder mask and through nickel plating and tin plating. After nickel and tin plating, a tape test was used to check solder mask adhesion on a target pattern. Scanning Electron Microscope (SEM) images of the micro-roughened copper surface, a nickel plated surface, and a tin plated surface were provided as described in more detail below.

Example 1

A microetching composition was prepared having the following composition:

| | |
|---|---|
| 10 g/l | 3-hydroxypyridine |
| 74 ml/l | Copper chloride (CuCl$_2$) |
| 30 ml/l | Hydrochloric acid (HCl) |
| P-400 | (polyethylenimine, Mn-423) (available from Aldrich Chemical Company) |

Figure 1B:
Figure 1C:
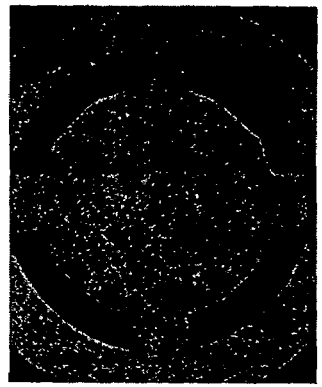
Figure 2A:
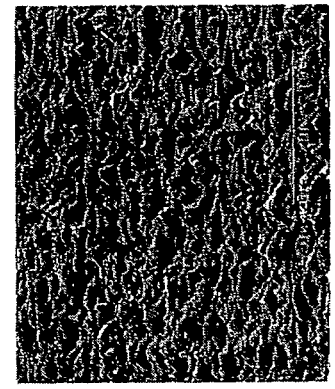
FIGS. 2A-2C depict SEM images of another copper substrate treated with a microetching composition of the invention, in which the concentration of picoline is varied.
Figure 2B:
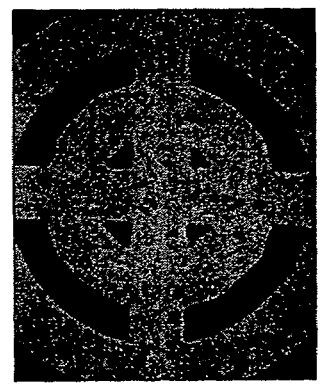
Figure 2C:
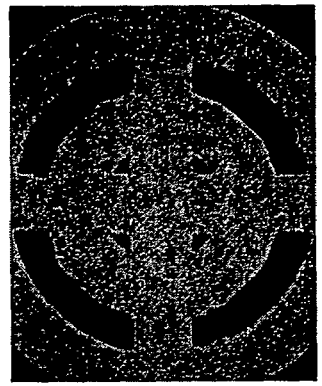
Figure 5C:
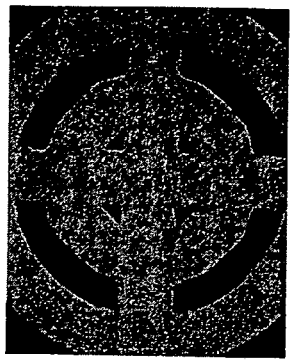
FIGS. 5A-5C depict SEM images of another copper substrate treated with a microetching composition of the invention, in which the concentration of picoline is varied.
Figure 5B:
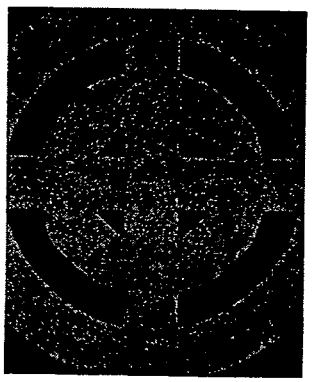
Figure 5A:
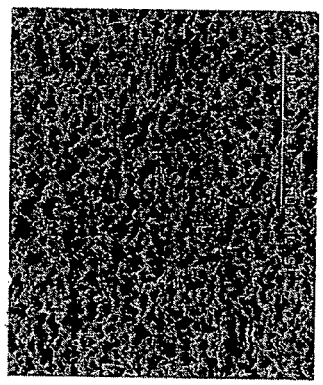
Figure 6C:
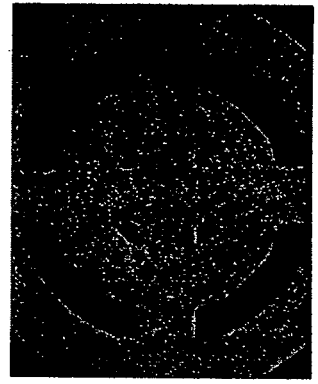
FIGS. 6A-6C depict SEM images of another copper substrate treated with a microetching composition of the invention, in which the concentration of picoline is varied.
Figure 6B:
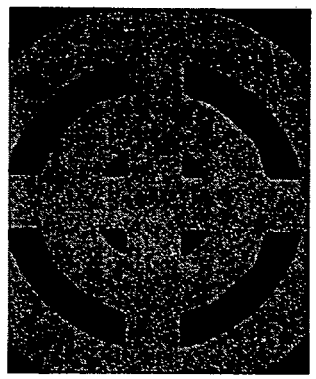
Figure 6A:
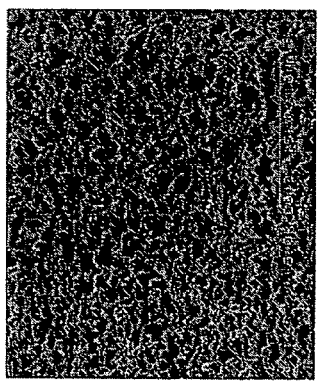

A copper panel was roughened using the above prepare microetching composition. Under such conditions, the surface showed non-uniformity with an etching depth of 87 micro-inches, and with a significant difference between shining and matte portions of the surface. An SEM image of the roughened surface is provided in FIG. 1A. As seen in FIGS. 1B and 1C, tape tests showed that the solder mask had slight damage on the nickel plated panel but showed severe damage on the tin plated panel.

Example 2

A microetching composition was prepared having the following composition:

| | |
|---|---|
| 74 ml/l | Copper chloride (CuCl$_2$) |
| 100 ppm | P-400 (polyethylenimine, Mn-423) (available from Aldrich Chemical Company) |
| | H$_2$SO$_4$ (for pH adjustment) |
| | Picoline (concentrations set forth below) |

Picoline demonstrated the function to achieve a rough surface when tested in the laboratory, but formed a thin layer of organic coating on the copper surface once the concentration was above 50 ml/l. When P-400 multiethyleneamine was added to the picoline solution, a uniform copper surface was obtained, especially when the solution was applied by spraying. It was determined that the picoline concentration could be as high as 125 ml/l to yield a rough surface. When the concentration of P-400 was maintained at 100 ppm, SEM showed that a higher concentration of picoline gave a rougher copper surface. When the picoline concentration was below 50 ml/l, the surface was not uniform, and some parts of copper still showed a shiny surface. The tape tests showed some damage on nickel and tin plated panels when the picoline concentration was below 100 ml/l.

After the picoline concentration was increased to about 100 ml/l, the nickel plated panel did not shown any damage, while the tin plated panel still showed some damage, as in FIGS. 2A-6C, as set forth below.

The concentration of picoline in the composition was varied as follows:

| | | |
|---|---|---|
| 30 ml/l | picoline | (FIGS. 2A-2C) |
| 60 ml/l | picoline | (FIGS. 3A-3C) |
| 80 ml/l | picoline | (FIGS. 4A-4C) |
| 100 ml/l | picoline | (FIGS. 5A-5C) |
| 120 ml/l | picoline | (FIGS. 6A-6C) |

Example 3

Figure 9A:
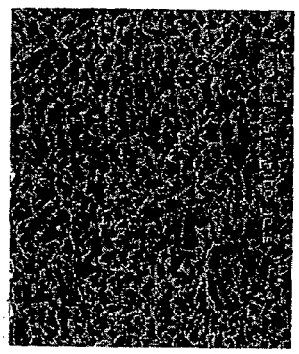
FIGS. 9A-9C depict SEM images of another copper substrate treated with a microetching composition of the invention, in which the concentration of multiethylene amine is varied.
Figure 9B:
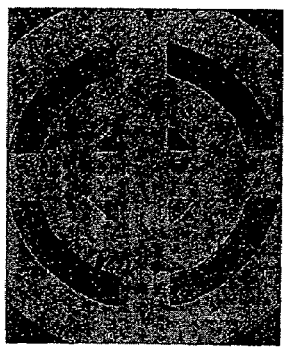
Figure 9C:
Figure 10A:
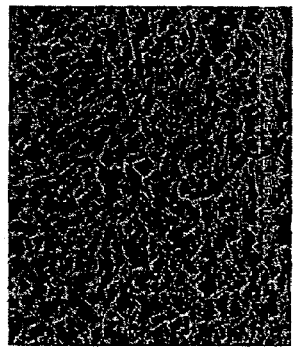
FIGS. 10A-10C depict SEM images of another copper substrate treated with a microetching composition of the invention, in which the concentration of multiethylene amine is varied.
Figure 10B:
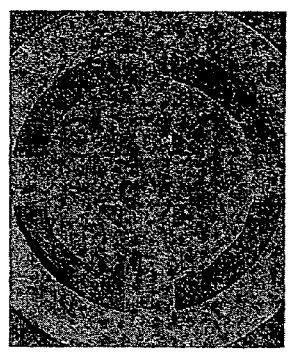
Figure 10C:
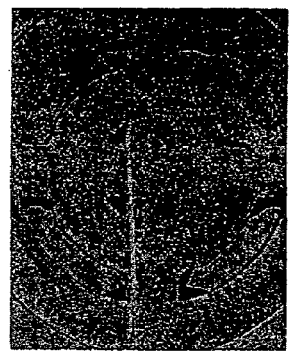

A similar microetching solution to Example 2 was prepared, except that the picoline concentration was controlled at 75 ml/l. In this example, the copper concentration was maintained at 15 g/l, and H$_2$SO$_4$ was added to control the pH to between 0.3 and 1.5. The P-400 concentration was varied as follows:

| | | |
|---|---|---|
| 200 ppm | P-400 | (FIGS. 7A-7C) |
| 300 ppm | P-400 | (FIGS. 8A-8C) |
| 400 ppm | P-400 | (FIGS. 9A-9C) |
| 500 ppm | P-400 | (FIGS. 10A-10C) |

All of these panels were processed through the spray microetching solution with a dwell time of 40 seconds. Microetching depths were determined to be about 70 microinches in the copper surface.

Figure 11A:
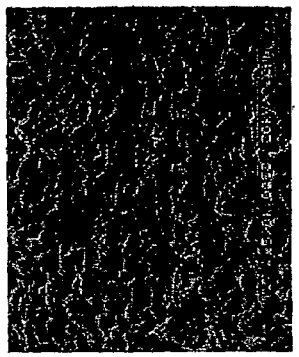
FIGS. 11A-11F depict SEM images of copper surfaces treated with various compositions prepared in accordance with the present invention.
Figure 11B:
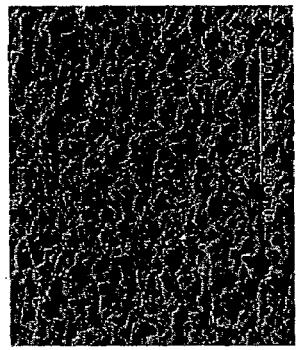
Figure 11C:
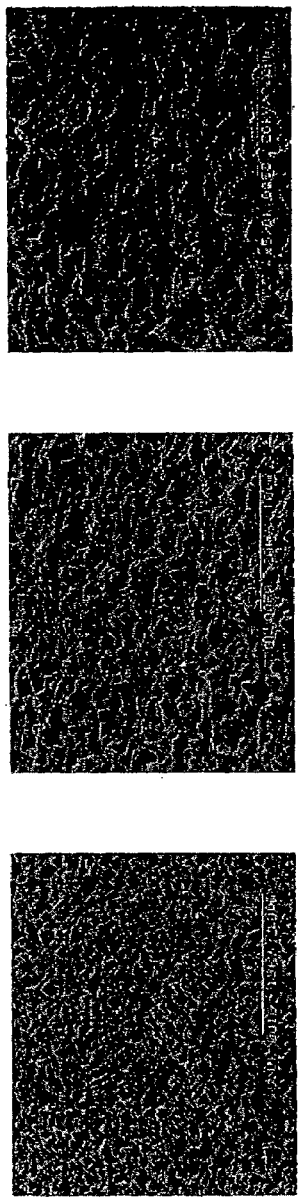
Figure 11D:
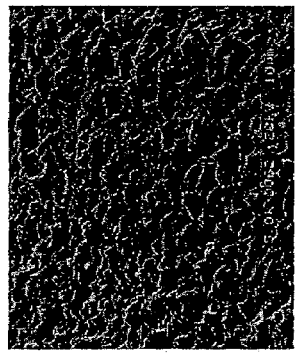
Figure 11E:
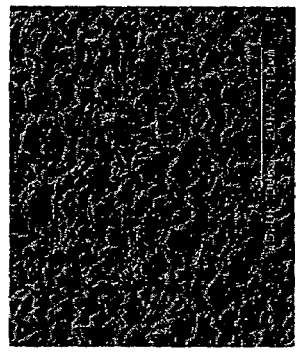
Figure 11F:
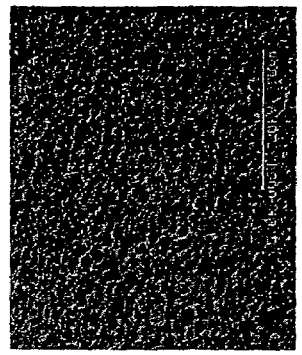

Next, copper panels were processed with microetching solutions as set forth below with a dwell time of 30 seconds. Microetching depths were determined to be about 50-60 microinches in the copper surface. SEMs of the micro-roughened copper panels are provided in FIGS. 11A-11F under the following conditions:

| | | |
|---|---|---|
| FIG. 11A: | 75 ml/l | picoline |
| | 500 ppm | P-400 |
| FIG. 11B: | 75 ml/l | picoline |
| | 600 ppm | P-400 |
| | pH = 0.80 | |
| FIG. 11C: | 75 ml/l | picoline |
| | 600 ppm | P-400 |
| | pH = 1.0 | |
| FIG. 11D: | 75 ml/l | picoline |
| | 700 ppm | P-400 |
| FIG. 11E: | 75 ml/l | picoline |
| | 800 ppm | P-400 |
| FIG. 11F. | 75 ml/l | picoline |
| | 1000 ppm | P-400 |

Comparative Example 1

A copper panel was roughened by mechanical scrubbing the panel. A SEM image of the roughened surface is provided in FIG. 12A. The tape test demonstrated that the solder mask applied on the mechanically scrubbed panel had poor adhesion since the solder mask was taped off, as depicted in FIGS. 12B and 12C

Comparative Example 2

A copper panel was roughened using a chemical microetching composition having standard peroxide/sulfuric acid chemistry.

The panels were processed through spray preclean equipment, and a microetching depth of about 50 microinches in the copper surface was obtained. A SEM image of the roughened surface is provided in FIG. 13A. The tape test showed that the solder mask had little damage on the nickel plated panel but severe damage on the tin plated panel, as depicted in FIGS. 13B and 13C.

Comparative Example 3

A copper panel was roughened using a microetching composition comprising formic acid with sodium formate. An example of this type of microetching composition is described in U.S. Pat. No. 4,007,037 to Lukes et al., the subject matter of which is herein incorporated by reference in its entirety.

Figure 14A:
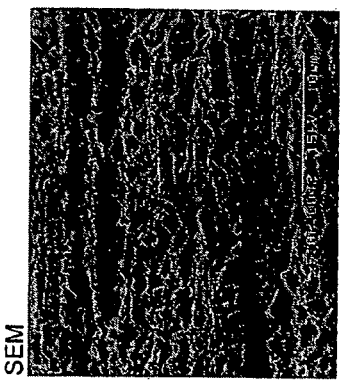
FIGS. 14A-14C depict SEM images of a copper substrate treated with a microetching composition based on formic acid/sodium formate chemistry.
Figure 14B:
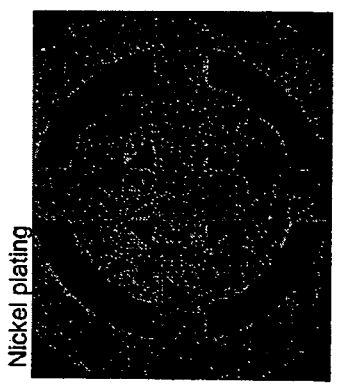
Figure 14C:
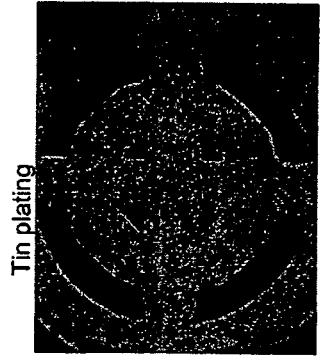

The panels were processed through spray preclean equipment, and a microetching depth of about 46 microinches in the copper surface was obtained. An SEM image of the roughened surface is provided in FIG. 14A. As seen in FIGS. 14B and 14C, the tape test showed that the solder mask had little damage on the nickel plated panel but severe damage on the tin plated panel.

Comparative Example 4

Figure 15A:
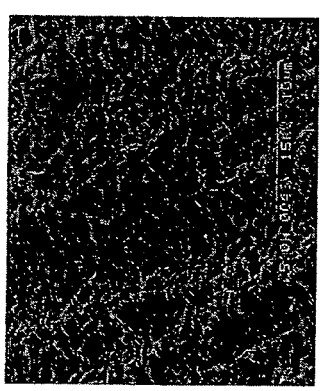
FIGS. 15A-15C depict SEM images of a copper substrate treated with a microetching composition based on formic acid/sodium formate chemistry with the addition of multiethylene amine.
Figure 15B:
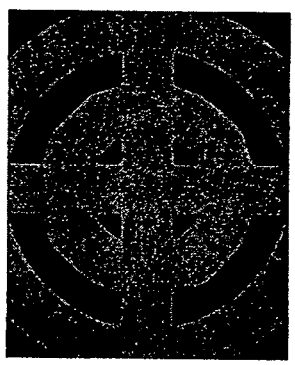
Figure 15C:
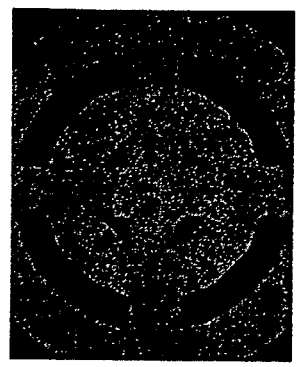

The microetching composition of Comparative Example 4 was modified by adding multiethyleneamine (P-400, available from Aldrich chemical company). A copper panel roughened using the modified formic acid/formate composition yield a surface that became slightly non-uniform, wherein some parts of the panel were darker than the panel treated with the unmodified formic acid/formate composition and some parts were lighter. This can be seen in the SEM of the roughened surface provided in FIG. 15A. The microetching depth was about 63 microinches in the copper surface. As seen in FIGS. 15B and 15C, tape tests showed that the solder mask had slight damage on the nickel plated panel and had some damage on the tin plated panel.

As is seen from the examples, a microetching composition comprising copper chloride, picoline, multiethyleneamine, and acid gives a uniform rough copper surface during the microetching process, which gives excellent adhesion for a solder mask during nickel plating. The microetching composition also showed improvement for tin plating.

What is claimed is:

1. A method of roughening a copper or copper alloy surface to provide improved adhesion of a layer subsequently applied thereto, comprising contacting the copper or copper alloy surface with a microetching composition comprising a cupric ion source, a pyridine derivative, multiethyleneamine, and an acid in an amount and for a period of time to roughen the surface.

2. The method according to claim 1, wherein the cupric ion source is present in the microetching solution at a concentration of about 10-50 g/l.

3. The method according to claim 2, wherein the cupric ion source is present in the microetching solution at a concentration of about 20-30 g/l.

4. The method according to claim 1, wherein the pyridine derivative is picoline.

5. The method according to claim 1, wherein the pyridine derivative is present in the microetching solution at a concentration of about 25-125 ml/l.

6. The method according to claim 5, wherein the pyridine derivative is present in the microetching solution at a concentration of about 50-100 ml/l.

7. The method according to claim 1, wherein the multiethyleneamine is present in the microetching solution at a concentration of about 100-1000 parts per million.

8. The method according to claim 7, wherein the multiethyleneamine is present in the microetching solution at a concentration of about 100-600 parts per million.

9. The method according to claim 1, wherein the acid is sulfuric acid.

10. The method according to claim 1, wherein the microetching solution further comprises sodium chloride or hydrochloric acid.

11. The method according to claim 1, wherein the acid is present in the solution in an amount sufficient to control the pH to between about 0.3-3.5.

12. The method according to claim 1, wherein the microetching solution is applied by spraying the microetching solution onto the copper or copper alloy substrate with a dwell time of about 25-45 seconds.

13. The method according to claim 12, wherein the dwell time is about 30 to about 40 seconds.

14. The method according to claim 1, wherein the microetching depth of the copper or copper alloy surface is about 50-70 microinches.

15. The method according to claim 14 wherein the microetching depth of the copper or copper alloy surface is about 55-65 microinches.

16. The method according to claim 1, wherein the multiethyleneamine is polyethyleneimine.

17. The method according to claim 16, wherein the polyethyleneimine has a molecular weight between about 400 and about 600.

* * * * *